United States Patent
Adusumilli et al.

(10) Patent No.: US 9,722,038 B2
(45) Date of Patent: Aug. 1, 2017

(54) METAL CAP PROTECTION LAYER FOR GATE AND CONTACT METALLIZATION

(71) Applicant: INTERNATIONAL BUSINESS MACHINES CORPORATION, Armonk, NY (US)

(72) Inventors: Praneet Adusumilli, Albany, NY (US); Hemanth Jagannathan, Niskayuna, NY (US); Alexander Reznicek, Troy, NY (US); Oscar Van Der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/852,459

(22) Filed: Sep. 11, 2015

(65) Prior Publication Data

US 2017/0077256 A1 Mar. 16, 2017

(51) Int. Cl.

| | |
|---|---|
| *H01L 29/49* | (2006.01) |
| *H01L 29/40* | (2006.01) |
| *H01L 29/66* | (2006.01) |
| *H01L 21/768* | (2006.01) |
| *H01L 23/528* | (2006.01) |
| *H01L 23/532* | (2006.01) |
| *H01L 21/28* | (2006.01) |
| *H01L 27/088* | (2006.01) |

(52) U.S. Cl.
CPC .... *H01L 29/4966* (2013.01); *H01L 21/28088* (2013.01); *H01L 21/7684* (2013.01); *H01L 21/7685* (2013.01); *H01L 21/76802* (2013.01); *H01L 21/76843* (2013.01); *H01L 21/76877* (2013.01); *H01L 23/528* (2013.01); *H01L 23/53209* (2013.01); *H01L 27/088* (2013.01); *H01L 29/401* (2013.01); *H01L 29/6656* (2013.01); *H01L 29/66545* (2013.01)

(58) Field of Classification Search
CPC .................................. H01L 29/66545
See application file for complete search history.

(56) References Cited

U.S. PATENT DOCUMENTS

| | | | |
|---|---|---|---|
| 5,677,238 A | 10/1997 | Gn | |
| 6,261,950 B1 | 7/2001 | Tobben | |
| 6,642,585 B2 | 11/2003 | Ohuchi | |
| 6,897,534 B2 | 5/2005 | Ohuchi | |
| 7,585,716 B2 * | 9/2009 | Cheng | H01L 29/42368 257/E21.453 |
| 7,772,053 B2 | 8/2010 | Kameshiro | |
| 8,119,486 B2 | 2/2012 | Kim | |
| 8,283,226 B2 | 10/2012 | Fukuda | |
| 8,629,515 B2 * | 1/2014 | Yeh | H01L 21/28105 257/249 |

(Continued)

*Primary Examiner* — Earl Taylor
(74) *Attorney, Agent, or Firm* — Daniel P. Morris, Esq.; Otterstedt, Ellenbogen & Kammer, LLP

(57) ABSTRACT

A CMOS fabrication process provides metal gates and contact metallization protected by metal cap layers resistant to reagents employed in downstream processing. Cobalt gates and contact metallization are accordingly feasible in CMOS processing requiring downstream wet cleans and etch processes that would otherwise compromise or destroy them. Low resistivity metal cap materials can be employed.

20 Claims, 4 Drawing Sheets

(56) References Cited

U.S. PATENT DOCUMENTS

| | | | |
|---|---|---|---|
| 8,779,530 B2* | 7/2014 | Lim | H01L 29/4966 257/288 |
| 8,860,135 B2* | 10/2014 | Hsu | H01L 21/2855 257/330 |
| 9,018,711 B1* | 4/2015 | Cai | H01L 21/28008 257/369 |
| 9,059,253 B2 | 6/2015 | Cheng | |
| 9,105,497 B2* | 8/2015 | Hong | H01L 27/092 |
| 9,129,953 B2* | 9/2015 | Lim | H01L 29/4966 |
| 9,202,691 B2* | 12/2015 | Huang | H01L 29/4966 |
| 9,257,289 B2* | 2/2016 | Leobandung | H01L 21/28088 |
| 9,293,550 B2* | 3/2016 | Fumitake | H01L 29/78 |
| 9,306,023 B2* | 4/2016 | Ho | H01L 29/4966 |
| 9,437,714 B1* | 9/2016 | Adusumilli | H01L 29/66795 |
| 2006/0208318 A1* | 9/2006 | Sakamoto | H01L 21/28088 257/369 |
| 2007/0036892 A1* | 2/2007 | Haukka | C23C 16/0218 427/248.1 |
| 2007/0134898 A1* | 6/2007 | Takeoka | H01L 21/28097 438/592 |
| 2008/0048271 A1* | 2/2008 | Yang | H01L 21/823807 257/369 |
| 2008/0076216 A1* | 3/2008 | Pae | H01L 21/28088 438/257 |
| 2008/0185637 A1* | 8/2008 | Nagaoka | H01L 29/66545 257/327 |
| 2009/0321795 A1* | 12/2009 | King | H01L 21/28052 257/288 |
| 2010/0006955 A1* | 1/2010 | Takimoto | H01L 29/42368 257/410 |
| 2010/0224916 A1* | 9/2010 | Shimizu | H01L 21/28176 257/288 |
| 2010/0308405 A1* | 12/2010 | Cai | H01L 29/0847 257/347 |
| 2011/0049624 A1* | 3/2011 | Guo | H01L 21/84 257/347 |
| 2011/0147858 A1* | 6/2011 | Lim | H01L 29/4966 257/412 |
| 2012/0043623 A1* | 2/2012 | Doris | H01L 21/28114 257/410 |
| 2012/0043624 A1 | 2/2012 | Liang | |
| 2012/0139062 A1* | 6/2012 | Yuan | H01L 21/76897 257/411 |
| 2013/0214357 A1* | 8/2013 | Chang | H01L 29/66545 257/347 |
| 2013/0237046 A1* | 9/2013 | Lin | H01L 29/4966 438/591 |
| 2014/0001543 A1* | 1/2014 | Kim | H01L 29/66636 257/330 |
| 2014/0070282 A1 | 3/2014 | Fan | |
| 2014/0087537 A1* | 3/2014 | Kim | H01L 29/66477 438/301 |
| 2014/0110778 A1* | 4/2014 | Fumitake | H01L 29/78 257/330 |
| 2014/0117421 A1 | 5/2014 | Seo | |
| 2014/0124841 A1 | 5/2014 | Xie | |
| 2014/0131809 A1* | 5/2014 | Ando | H01L 21/02697 257/369 |
| 2014/0183738 A1* | 7/2014 | Jezewski | H01L 23/485 257/751 |
| 2014/0203333 A1* | 7/2014 | Huang | H01L 29/4966 257/288 |
| 2014/0239407 A1 | 8/2014 | Manabe | |
| 2014/0295659 A1* | 10/2014 | Lim | H01L 29/4966 438/591 |
| 2015/0016174 A1* | 1/2015 | Liu | H01L 27/11206 365/96 |
| 2015/0061027 A1* | 3/2015 | Hong | H01L 27/092 257/369 |
| 2015/0076624 A1* | 3/2015 | Liu | H01L 21/32115 257/412 |
| 2015/0108577 A1* | 4/2015 | Cai | H01L 21/28008 257/369 |
| 2015/0137195 A1* | 5/2015 | Lin | H01L 21/28247 257/288 |
| 2015/0145057 A1* | 5/2015 | Fan | H01L 27/092 257/369 |
| 2015/0179579 A1* | 6/2015 | Jezewski | H01L 21/76846 257/753 |
| 2015/0206963 A1* | 7/2015 | Ho | H01L 21/31111 257/411 |
| 2015/0221743 A1* | 8/2015 | Ho | H01L 29/4966 257/392 |
| 2015/0255294 A1* | 9/2015 | Leobandung | H01L 21/28088 257/410 |
| 2015/0262822 A1* | 9/2015 | Hung | H01L 21/28088 257/412 |
| 2015/0262823 A1* | 9/2015 | Hung | H01L 21/2855 257/368 |
| 2015/0279838 A1* | 10/2015 | Tsao | H01L 29/66553 257/383 |
| 2015/0279954 A1* | 10/2015 | Chen | H01L 21/0254 257/410 |
| 2015/0311206 A1* | 10/2015 | Hong | H01L 27/092 257/369 |
| 2015/0357435 A1* | 12/2015 | Lim | H01L 29/4966 438/592 |
| 2015/0380406 A1* | 12/2015 | Chang | H01L 27/0922 257/369 |
| 2016/0049491 A1* | 2/2016 | Lin | H01L 29/4966 257/410 |
| 2016/0079383 A1* | 3/2016 | Huang | H01L 29/4966 257/407 |
| 2016/0365347 A1* | 12/2016 | Bao | H01L 27/0924 |

* cited by examiner

METAL CAP PROTECTION LAYER FOR GATE AND CONTACT METALLIZATION

FIELD

The present disclosure relates generally to semiconductor devices, and more specifically, to metal cap layers for protecting gate and contact metallization during downstream processing.

BACKGROUND

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Planar transistors, such as metal oxide semiconductor field effect transistors (MOSFETs) are particularly well suited for use in high-density integrated circuits. As the size of MOSFETs and other devices decreases, the dimensions of source/drain regions, channel regions, and gate electrodes of the devices, also decrease.

The use of metal gates within metal-oxide-semiconductor (MOS) transistors has developed with respect to both planar and three dimensional devices such as FinFET devices. Gate structures including a high-k dielectric layer and one or more metal layers that function as gate electrodes have been implemented. Replacement gate techniques, which are sometimes called "gate last" techniques, involve forming a "dummy" or sacrificial gate structure. The sacrificial gate structure remains present during various other fabrication processes, such as the formation of source/drain regions and possible annealing steps. The sacrificial gate structure is then removed to define a gate cavity where the desired actual gate structure is formed. As middle-of-line (MOL) dimensions continue to decrease, currently employed metallization schemes that include the use of some metal fill materials such as tungsten (W) may not be able to meet resistance targets for future technology nodes. The high resistance associated with tungsten is a result of the need for thick titanium nitride (TiN) liners to prevent fluorine (F) diffusion and poor tungsten gap fill (seams/voids).

In some replacement gate processes, disposable gate level layers are deposited on a semiconductor substrate as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers after the pattern transfer form the disposable gate structures.

Disposable gate stacks may include, for example, first disposable gate structures formed over a first body region in a first device region (for example, an nFET region) and second disposable gate structures formed over a second body region in a second device region (for example, a pFET region). The first disposable gate structures can be a stack of a first disposable gate dielectric and gate material portions and first disposable gate cap portions, and the second disposable gate structures can be a stack of a second disposable gate dielectric and second disposable gate material portions and a second disposable gate cap portion. The first and second disposable gate cap portions are remaining portions of the disposable gate cap dielectric layer, the disposable gate material portions are remaining portions of the disposable gate material layer, and the disposable gate dielectric portions are remaining portions of the disposable gate dielectric layer.

Source/drain extension regions are formed after the disposable gate structures have been completed. For example, selected dopants can be implanted into portions of the first body region that are not covered by the first disposable gate structures to form source/drain extension regions. Similarly, other selected dopants can be implanted into portions of the second body region that are not covered by the second disposable gate structures. Gate spacers can be formed on sidewalls of each of the disposable gate structures, for example, by deposition of a conformal dielectric material layer and an anisotropic etch. Ion implantations can be employed to form source regions and drain regions for some devices. For example, dopants can be implanted into portions of the body regions that are not covered by the disposable gate structures and spacers.

A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are formed in the gate cavities. Replacement gate structures are formed by replacement of the disposable structures and overly channel regions of field effect transistors having permanent gate structures. A gate dielectric and a gate electrode are formed within each of the gate cavities. A gate dielectric layer can be deposited on the bottom surface and sidewall surfaces of each gate cavity and over the planarization dielectric layer. The gate dielectric layer can be deposited as a contiguous gate dielectric layer that contiguously covers all top surfaces of the planarization dielectric layer and all inner sidewall surfaces of the gate spacers. The gate dielectric layer can be a high dielectric constant (high-k) material layer having a dielectric constant greater than 3.9. Gate dielectric layers can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition.

The replacement gate structures can include gate electrodes having different compositions in different regions of the substrate. For example, a first work function material layer can be deposited on the gate dielectric layers in one region and a second work function material can be deposited on the gate dielectric layers in a second region. A conductive material layer can be deposited on the work function material layers. The conductive material layer can include a conductive material deposited by physical vapor deposition, chemical vapor deposition, and/or electroplating. The conductive material layer can be an aluminum layer, a tungsten layer, an aluminum alloy layer, or a tungsten alloy layer. Tungsten can be deposited by chemical vapor deposition. Portions of the gate conductor layer, the work function material layers, and the gate dielectric layers are removed from the planarization dielectric layer by a planarization process. Replacement gate structures are thus formed, which include gate conductor layers, work function material layers, and gate dielectric layers.

Self-aligned contacts facilitate alignment during fabrication of integrated circuit devices having small dimensions. Such contacts have been formed by depositing metals such as aluminum and tungsten in trenches formed in dielectric materials while avoiding electrical contact with metal gate material. Self-aligned contacts can accordingly be formed within a metal gate process while preventing gate to contact shorts. Metal deposition processes have been developed for filling vias etched within multiple layers of electrically insulating material. The vias are filled with an electrically conducting metallization that preferably minimizes voids within the vias or other pathways while providing low resistance contact to active silicon device regions. Barrier layers, which sometimes include multiple layers, are further provided to prevent penetration of metallization components into the silicon and active device contact regions.

SUMMARY

Principles of the present disclosure provide techniques for integrating metal gate materials having performance advantages and protecting such materials during downstream processing.

In accordance with a first exemplary embodiment, a method is provided that includes obtaining a semiconductor substrate, forming a sacrificial gate on the semiconductor substrate, and forming spacers on the sacrificial gate, the spacers having top surfaces. The sacrificial gate is removed, thereby forming a trench bounded by the spacers and a gate dielectric layer is formed within the trench. A first barrier layer is formed on the gate dielectric layer and a cobalt gate is formed on the first barrier layer. The method further includes forming a first metal cap layer sealing the cobalt gate, the first metal cap layer being entirely within the trench and entirely beneath the top surfaces of the spacers. The first metal cap layer is less chemically reactive to one or more selected reagents than the cobalt gate. A dielectric cap is formed within the trench and on the first metal cap layer.

An exemplary structure includes a semiconductor substrate and a plurality of gate structures on the substrate. Each gate structure includes a pair of spacers defining a trench, the spacers including top surfaces, a cobalt gate within the trench, a gate dielectric layer between the semiconductor substrate and the cobalt gate, and a barrier layer between the gate dielectric layer and the cobalt gate. A first metal cap layer seals the cobalt gate. The first metal cap layer is positioned entirely beneath the top surfaces of the spacers and has greater chemical resistance to one or more selected reagents than cobalt. A dielectric cap is within the trench and on the first metal cap layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed.

Substantial beneficial technical effects are provided. For example, one or more embodiments may provide one or more of the following advantages:

Meeting resistance targets for replacement gate structures;
Protecting cobalt gate metal and contacts during downstream processing;
Reducing voids during metallization;

These and other features and advantages of the present invention will become apparent from the following detailed description of illustrative embodiments thereof, which is to be read in connection with the accompanying drawings.

BRIEF DESCRIPTION OF THE DRAWINGS

The following detailed description, given by way of example, will best be appreciated in conjunction with the accompanying drawings, in which.

DETAILED DESCRIPTION

The present disclosure relates to methods of forming metal gate structures having metal caps for protecting underlying gate metal(s) and metal contacts. The disclosure further relates to structures including replacement gates and self-aligned metal cap layers that protect gate and contact metallization during downstream processing.

Figure 1:
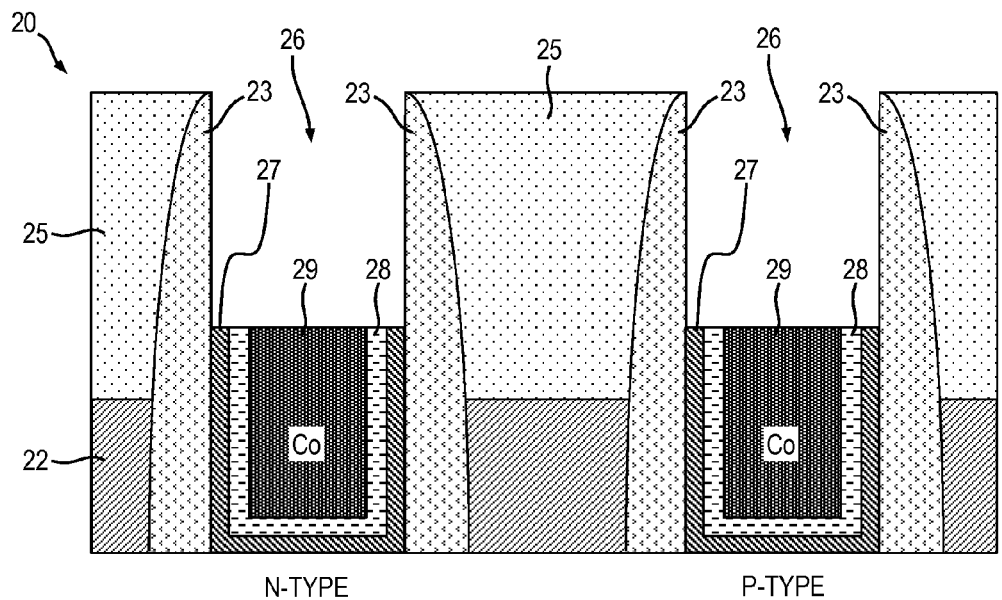
FIG. 1 is a schematic, cross-sectional view of a partially completed gate structure.

FIG. 1 schematically illustrates a partially completed semiconductor structure 20 that can be formed using replacement gate technology substantially as described above. The semiconductor structure includes electrically isolated n-type and p-type regions. While shown as a structure including a substrate having semiconductor fins 22 as used in the fabrication of FinFET devices, the techniques described herein are also applicable to planar structures. The n-type region(s) are used for forming nFET devices and the p-type regions are for forming pFET devices. Dielectric and polysilicon layers may be deposited on the finned substrate and patterned to form a dummy gate in accordance with standard polysilicon gate CMOS process flows. Gate sidewall structures or spacers 23 are formed on the dummy gate. A silicon nitride ($Si_3N_4$) layer can be deposited via CVD, PECVD, sputtering, or other suitable technique, forming the spacers 23. The spacers can include a single layer or be multi-layer. Spacer thickness is between two and ten nanometers (2-10 nm) in some embodiments. Spacers can be formed by any method known in the art, including depositing a conformal nitride layer over the dummy gate structures and removing unwanted material using an anisotropic etching process such as reactive ion etching or plasma etching. The dummy gate structures (not shown) and associated spacers 23 protect the underlying portions of the semiconductor fins 22 that later function as channel regions of FinFET devices. Fin regions outside the dummy gate structures and spacers 23 later function as source/drain regions. Expanded source/drain structures (not shown) can be grown epitaxially on the exposed source/drain portions of the semiconductor fins 22. Either p-type devices or n-type devices can be fabricated depending on the conductivity types of the epitaxial source/drain structures, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. In a silicon-containing substrate examples of n-type dopants, i.e., impurities, include but are not limited to antimony, arsenic and phosphorous. In embodiments where n-type FinFET devices are to be formed, in-situ n-doped silicon may be used to form the epitaxial source/drain structures. In-situ doping of the source/drain structures can be conducted using conventional precursor materials and techniques. Source/drain epitaxy to form p-doped source/drain regions may include the introduction of boron precursor gas such as diborane. The p-doped source/drain structures may consist essentially of boron-doped silicon germanium in one or more exemplary embodiments. Exemplary epitaxial growth processes that are suitable for use in forming the silicon and silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. If the replacement gate technique is employed in conjunction with the formation of planar devices, conventional implantation of the substrate may be employed to form source/drain regions. Once the source/drain regions have been formed and other possible processing steps completed, an electrically insulating layer 25 is deposited on the structure and about the dummy gate. The layer 25 is planarized to expose the polysilicon layer of the dummy gate.

The dummy gate can be removed by reactive ion etching (RIE) and/or wet chemical etching to form a recess 26 bounded by the spacers 23. The recess is then filled in part with a gate dielectric layer 27, a work function setting material 28, and metal (cobalt) gate 29. FIG. 1 shows a structure 20 that is obtained following dummy gate removal, deposition of a high-k gate dielectric layer, deposition of the work function setting material (WFM), deposition of metal fill (gate) material, and recessing of the metal fill and adjoining materials. A portion of the originally formed recess 26 accordingly remains above the metal gate 29.

Metallization schemes involving materials such as tungsten may not be ideal for developing technology nodes or some other applications. Alternative electrically conductive materials, even if superior to tungsten in one or more respects, need to be compatible with CMOS processing techniques that may follow metallization. Cobalt (Co) is employed as a gate metal in the exemplary embodiment shown in FIGS. 1-4 and as a contact metal in the exemplary embodiment of FIGS. 5-7. Cobalt can be deposited using conventional techniques such as chemical vapor deposition, and may be able to significantly reduce seams and voids in MOL structures, such as those shown in FIGS. 1-4. Cobalt has an electrical conductivity similar to that of tungsten. However, cobalt does not require relatively thick liners that would contribute to high resistance. For example, while 40Å of titanium nitride (TiN) is typically necessary for tungsten metallization, 15-20 Å of TiN is typically sufficient for cobalt metallization. A major challenge in the integration of cobalt in gate and contact metallization schemes is the chemical attacking of cobalt by etch processes (for example, reactive ion etch) and wet cleans during downstream processing. Various modules, including MOL and BEOL (back-end-of-line) patterning, require for example wet cleans such as hydrofluoric acid (HF). Such wet cleans will attack and rapidly dissolve cobalt when exposed. As described below, a process is provided that allows the use of cobalt as a gap fill material while protecting it from chemical attack, thereby enabling relatively low resistance and substantially void-free metallization that can outperform metals such as tungsten despite cobalt's vulnerability to downstream processing.

Referring again to FIG. 1, a high-k gate dielectric layer is conformally deposited in the trench 26 following dummy gate removal. The thickness of the gate dielectric material can vary depending on the required device performance. Chemical vapor deposition or atomic layer deposition (ALD) can be employed for depositing a high-k dielectric material such as hafnium oxide. Other exemplary high-k dielectric materials include but are not limited to $ZrO_2$, $La_2O_3$, $Al_2O_3$, $TiO_2$, $SrTiO_3$, $LaAlO_3$, $Y_2O_3$, $HFO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. The gate dielectric layer used in some devices may alternatively include a multi-layer of $SiO_2$, SiON, SiN, and a high-k dielectric material, including but not limited to hafnium oxide ($HfO_2$), aluminium oxide ($Al_2O_3$), lanthanum oxide ($La_2O_3$), zirconium oxide ($ZrO_2$), and their respective silicates. The thickness of the gate dielectric may be in the range of 1.0 nm-5.0 nm. A titanium nitride (TiN) liner/barrier film layer 28 is then conformally deposited on the gate dielectric layer using, for example, an ALD process. The metal gate material 29 is deposited on the layer. The gate metal layer can be from about three nanometers (3 nm) to five hundred nanometers (500 nm) in thickness in exemplary embodiments, though lesser and greater thicknesses may also be employed. The resulting structure can be subjected to CMP to remove deposited materials from the top surface 24 of the dielectric layer 25. The materials within the trenches 26 are partially removed to create cavities bounded by the upper portions of the spacers 23 and the exposed surfaces of the metal gate 29, the barrier layer 28, and the gate dielectric layer 27. The cavities are formed to a depth of about three to one hundred (3-100) nanometers in some exemplary embodiments. It will be appreciated that the materials within the recesses 26 etch at different rates. Sequential wet or dry etches, or combinations thereof, can be employed for etching the exposed materials to form the cavities.

Figure 2A:
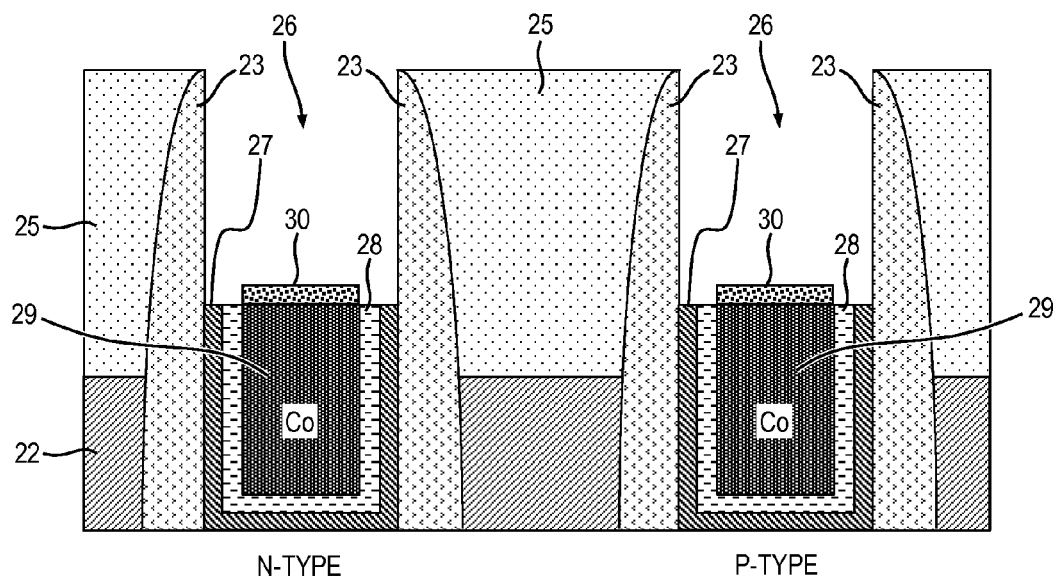
FIG. 2A is schematic, cross-sectional view of the gate structure shown in FIG. 1 including a selectively deposited metal layer.

In a first exemplary embodiment as shown schematically in FIG. 2A, a metal cap layer 30 is selectively deposited on the top surface of the metal gate 29 of the structure 20 shown in FIG. 1. Processes such as CVD, ALD or electroless deposition can be employed to deposit the cap layer. As known in the art, hydrogen-based processes may be employed to prepare/engineer an exposed metal surface such that subsequent metal deposition takes place only on the exposed metal surfaces and not on dielectric materials or barrier materials such as titanium nitride. Nucleation only takes place on an exposed conductive surface during the deposition of cap metal. The metal cap layer 30 may have a thickness between 3 nm to 500 nm. In some embodiments, the metal cap layer is in the range of 3-15 nm. Being substantially less chemically reactive than cobalt to substances such as hydrofluoric acid, the metal cap layer 30 effectively protects the metal gate during subsequent processing. As discussed further below, exemplary platinum group metals that may be used for the metal cap layer 30 are highly resistant to attack by most chemical reagents, including those used in CMOS fabrication techniques.

Figure 2B:
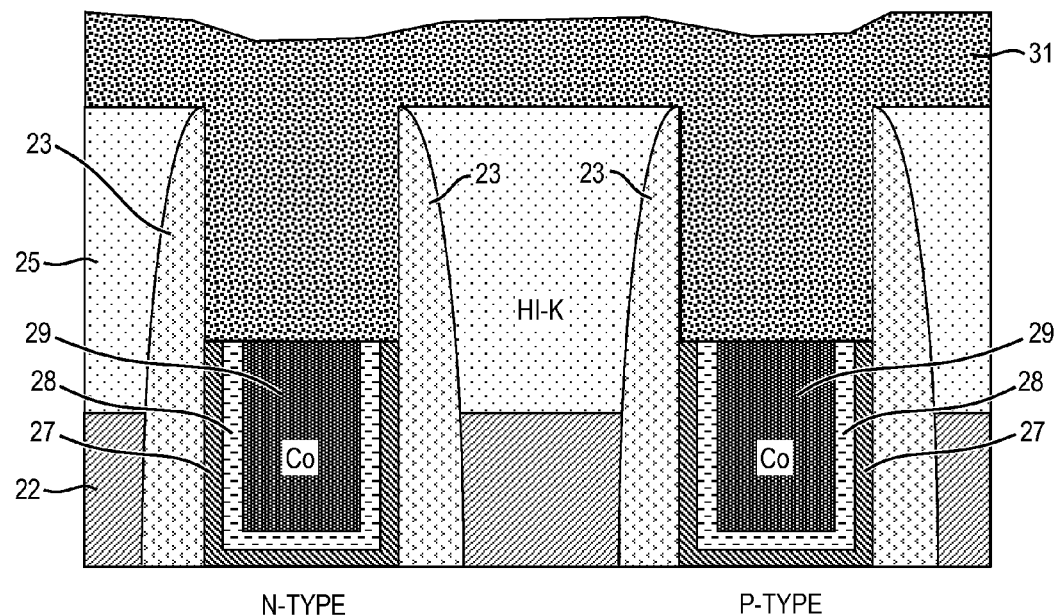
FIG. 2B is a schematic, cross sectional view showing self-aligned deposition of a metal cap layer on the gate structure of FIG. 1.
Figure 3:
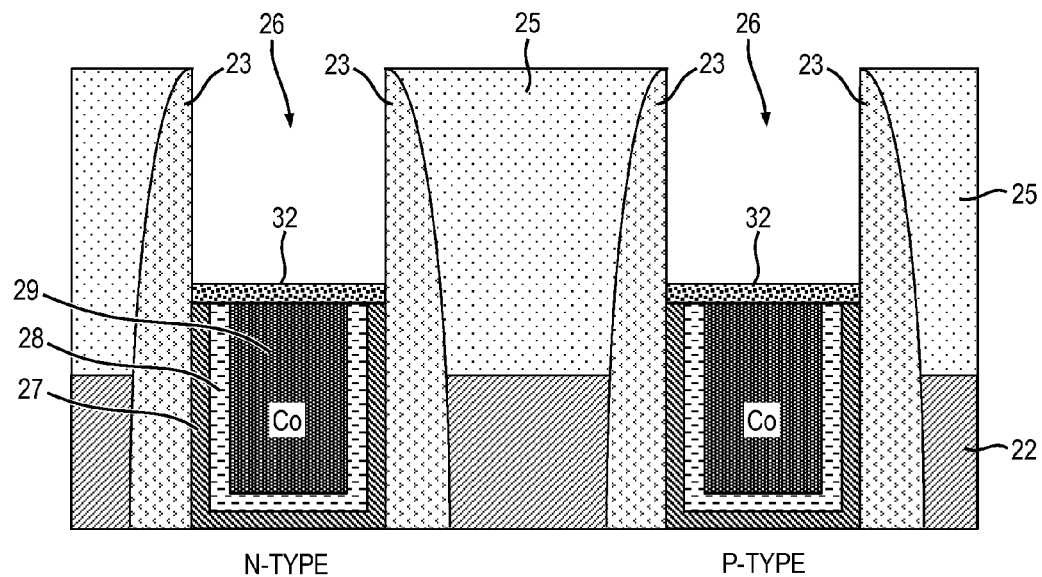
FIG. 3 is a schematic, cross-sectional view showing the structure of FIG. 2B following chemical mechanical planarization and recessing of the metal cap layer.

In a second exemplary embodiment shown in FIG. 2B, a self-aligned deposition of a metal layer 31 is formed on the structure 20 shown in FIG. 1 using, for example, CVD, ALD or electroless deposition processes. As discussed above, nucleation only occurs on the exposed electrically conductive surface during the deposition of cap metal. The metal layer 31 fills the portions of the trenches 26 above the metal gates 29 and is also deposited on the top surface of the structure 20. Metal layer deposition is followed by CMP and recessing of the metal layer 31 within the trenches 26. Metal cap layers 32 are accordingly formed on top of the metal gates 29, between the spacers 23, and below the top surfaces of the spacers 23. In both exemplary embodiments, a single gate material is employed and the metal cap layers 30 or 32 hermetically seal the metal gates, effectively protecting the cobalt metal gates 29 from subsequent etch process and wet cleans such as HF that could otherwise dissolve or compromise the cobalt metal gates. The metal cap layers 30, 32 in each embodiment can be single layer or multi-layer structures. Low resistivity metals such as ruthenium (Ru), rhodium (Rh), osmium (Os), iridium (Ir), molybdenum (Mo), platinum, palladium and alloys thereof are metal cap materials employed in some embodiments. Tungsten (W) metal cap layers may alternatively be employed to seal the top surfaces of the metal gates. In other embodiments, a bilayer metal cap layer is formed, such as tungsten/ruthenium. In some embodiments, a tungsten bilayer (W/W) is formed using two different deposition methods, first physical vapor deposition (PVD) to provide a layer having high purity, then chemical vapor deposition for a conformal tungsten fill.

Upon completion of the metal cap layers 30 or 32, the trenches 26 are filled with a dielectric material to form dielectric caps 33 on the metal cap layers to protect the gate during self-aligned contact etch. The caps may be formed from materials such as silicon nitride to facilitate the self-aligned contact (SAC) process. After deposition, the cap material is planarized to remove it from the dielectric layer 25. The dielectric cap material remains within the recess 26 following planarization, thus completing the structure 40 shown in FIG. 4. As discussed further below, the dielectric caps 33 are used to prevent shorting between the metal gate 29 and subsequently formed and possibly self-aligned contacts.

Figure 4:
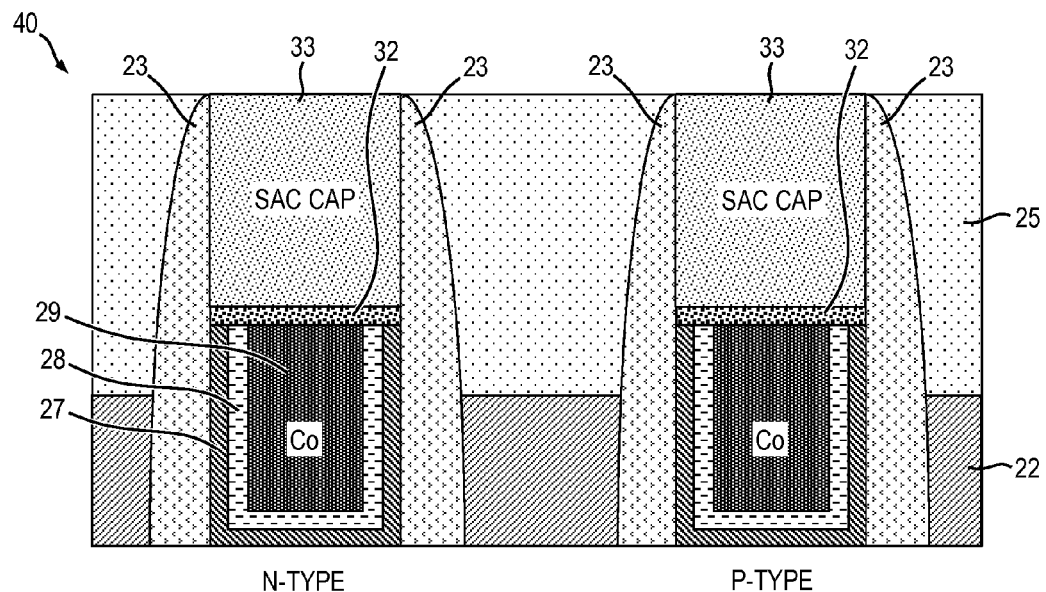
FIG. 4 is a schematic, cross-sectional view showing self-aligned deposition of a gate cap within the recess of the gate structure shown in FIG. 3.
Figure 5:
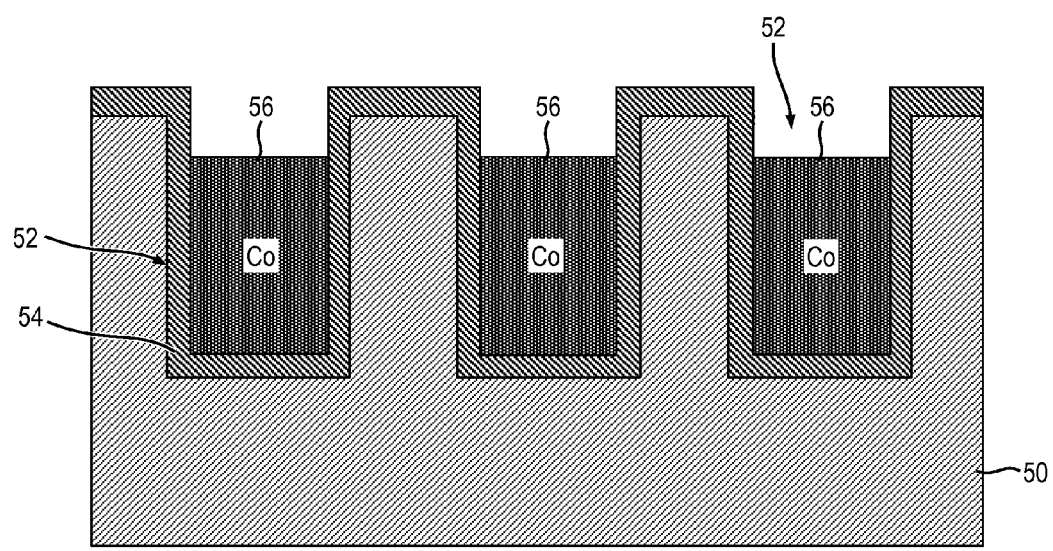
FIG. 5 is a schematic, cross-sectional illustration showing an exemplary step in the formation of a contact.
Figure 6:
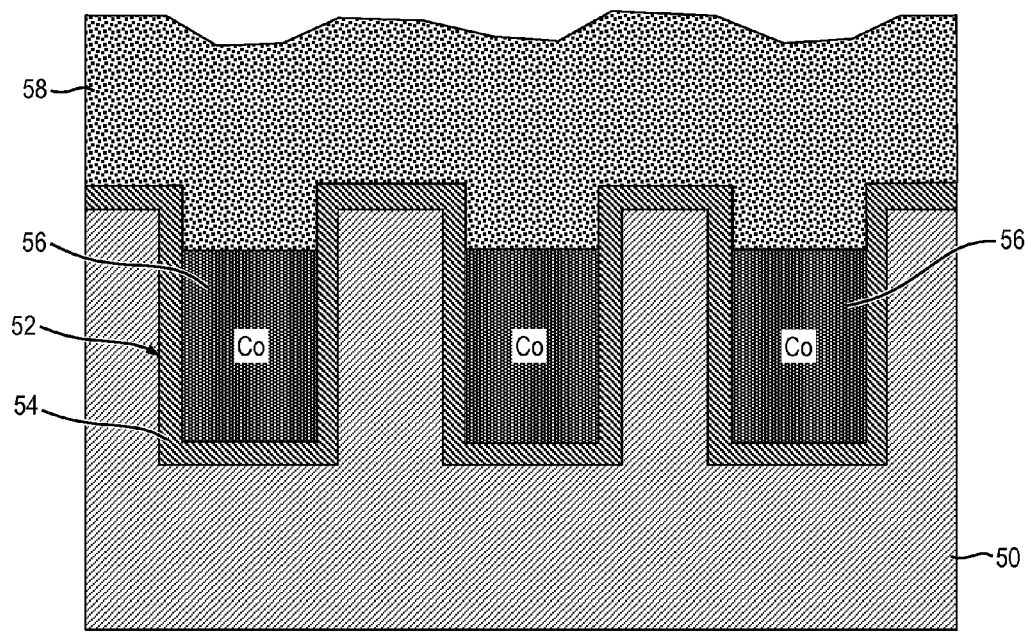
FIG. 6 is a schematic, cross-sectional illustration showing the self-aligned deposition of a metal cap layer on the structure shown in FIG. 5.
Figure 7:
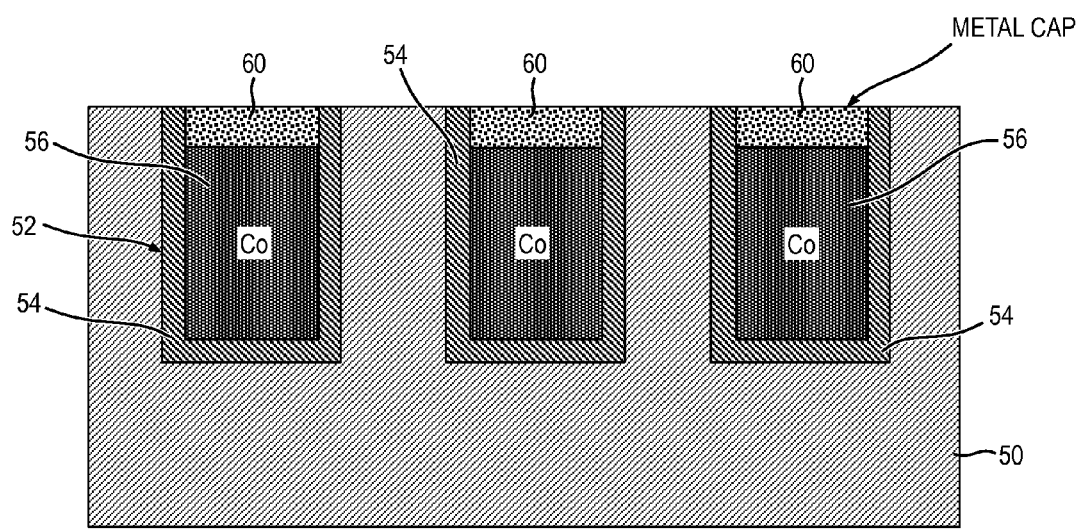
FIG. 7 is a schematic, cross-sectional illustration showing the structure of FIG. 6 following chemical mechanical planarization.

Referring to FIGS. 5-7, MOL fabrication involves multiple interconnect levels. Electrical connections throughout these levels, including connections to the source/drain regions of FETs, can benefit from the use of metals such as cobalt, but such use has not been feasible due to the effects of downstream processing. The figures provide a schematic representation of an exemplary interconnect level that includes a dielectric layer 50 in which trenches 52 are formed for providing electrical connections to other levels or devices, including device layers as discussed below with respect to FIGS. 1-4. The dielectric layer 50, for example silicon dioxide, can be formed using CVD or other known techniques on the substrate shown in FIG. 4, either directly on the top surface of the dielectric layer 25 or on another dielectric layer formed on the substrate. The lowest interconnect levels, such as levels including active regions containing devices as illustrated in FIG. 4, may include self-aligned contacts while the upper levels are not self-aligned. An exemplary process flow includes forming vias and/or other pathways in a dielectric layer using patterning and etching techniques familiar to those of skill in the art. As discussed above, cobalt has some performance advantages with respect to other metals that have been employed in CMOS processing, such as tungsten. In addition to using cobalt to form metal gate, it is also employed to form contacts during MOL fabrication in accordance with one or more embodiments. Referring to FIG. 5, a barrier layer 54 is conformally deposited on the structure, thereby lining the trenches 52 (and/or vertical vias) formed within the dielectric layer 50. The barrier layer is formed from a work function setting material such as a titanium nitride layer having a thickness of 15-20 Å in some embodiments. Other work function setting materials that may be used in some embodiments include TaN and WN. A cobalt layer 56 is deposited using chemical vapour deposition techniques on the barrier layer 54. The structure is planarized using a process such as chemical mechanical planarization down to the barrier layer 54. The cobalt layer 56 is then recessed so that the exposed top surface is beneath the plane of the dielectric layer 50. A structure as schematically illustrated in FIG. 5 is thereby obtained. Cobalt used as an electrically conductive material in contact structures formed during MOL processes would be subject to chemical attack during subsequent MOL or BEOL processing. As shown in FIG. 6, a self-aligned deposition of a metal layer 58 of ruthenium (Ru), rhodium (Rh), osmium (Os), iridium (Ir), molybdenum (Mo) or alloys thereof, seals the top surface of the structure, including the cobalt layer 56. In some embodiments, the metal layer 58 consists essentially of tungsten (W). Chemical vapour deposition and/or physical vapor deposition (PVD) are among the techniques that may be employed for depositing one or more of such metals to form the metal cap layers. The structure is subjected to further chemical mechanical planarization down to the top surface of the dielectric layer 50. Metal cap layers 60 having thicknesses greater than three nanometers (3 nm) remain on the formerly exposed surfaces of the cobalt layer 56, thereby protecting the contact structures from, for example, downstream etch processes and providing electrically conductive surfaces on the dielectric layer 50. The relatively thin barrier layer allows a relatively high proportion of cobalt within the contact structures, thereby improving electrical conductivity.

Given the discussion thus far, an exemplary CMOS fabrication method is provided that includes obtaining a semiconductor substrate, forming a sacrificial gate on the semiconductor substrate, and forming spacers on the sacrificial gate. The sacrificial gate is removed, thereby forming a trench 26 bounded by the spacers 23. Gate dielectric and barrier layers 27, 28 are formed within the trench and a cobalt gate 29 is formed on the barrier layer 28. A structure 20 as shown in FIG. 1 is accordingly obtained. A metal cap layer (30 in FIG. 2A, 32 in FIG. 3) is formed to seal the cobalt gate. The metal cap layer is entirely within the trench and entirely beneath the top surfaces of the spacers. It is further less chemically reactive to one or more selected reagents to be used in downstream CMOS processes than the cobalt gate, and accordingly protects the gate metal when cleaning and/or etch processes are performed that would otherwise damage the metal gate 29. A dielectric cap 33 is formed within the trench 26 and on the metal cap layer (30 or 32). The method can further include forming a dielectric layer 50 on the substrate and forming contact structures within the dielectric layer. Each of the contact structures including a pathway 52 within the dielectric layer, a barrier layer 54 lining the pathway, a cobalt layer 56 directly contacting the barrier layer, and a metal cap layer 60 directly contacting and sealing the cobalt layer. The cobalt layer 56 is recessed within the dielectric layer and the metal cap layer 60 is positioned in the recess. The metal cap layer 60 is less chemically reactive to the one or more selected reagents in the downstream CMOS process than the cobalt layer 56 and protects the underlying conductor from reagents such as hydrofluoric acid that would otherwise attack it. A plurality of interconnect layers with such contact structures can be formed on the substrate to provide the necessary electrical connections for the completed structure. The formation of the metal cap layers can further include causing self-aligned deposition of metal layer(s), such as shown in FIGS. 2B and 6. The metal layer(s) over the gate metal are planarized down to the top surfaces of the spacers 23 and then recessed within the trench 26. The metal layer(s) 58 formed on the electrical conductors within the pathways are planarized down to the top surface of the dielectric layer 50. As the contact metal in the pathways is recessed, metal cap layers 60 remain following planarization to protect the underlying conductors from subsequent processing. The barrier layers comprise titanium nitride in some embodiments. The titanium nitride layers can have a thickness of twenty nanometers or less. In some embodiments, the step of forming the metal cap layer that seals the metal gate further includes causing the selective deposition a metal layer on an exposed surface of the metal gate 29. The metal cap layers can be formed from metals selected from the group consisting of ruthenium (Ru), rhodium (Rh), osmium (Os), iridium (Ir), molybdenum (Mo) and alloys thereof.

An exemplary structure includes a semiconductor substrate and gate structures on the substrate. Each gate structure includes a pair of spacers 23 defining a trench 26, the spacers including top surfaces. A cobalt gate 29 is within each trench. A gate dielectric layer 27 is between the semiconductor substrate and the cobalt gate and a barrier layer 28 is between the gate dielectric layer and the cobalt gate. A metal cap layer 30/32 seals the cobalt gate 29 and is positioned entirely beneath the top surfaces of the spacers 23. The metal cap layers have greater chemical resistance to one or more selected reagents used subsequently in the CMOS fabrication process than cobalt and protects the integrity of the cobalt through such processes. A dielectric cap 33 is within each trench 26 and on each metal cap layer 30/32. The dielectric caps 33 are entirely within each trench and coplanar with the top surfaces of the spacers 23 in some embodiments. The semiconductor structure may further include a dielectric layer 50 on the substrate and contact structures within the dielectric layer. Each of the contact structures includes a pathway 52 within the dielectric layer, a barrier layer 54 lining the pathway, a cobalt layer 56 directly contacting the barrier layer, and a metal cap layer 60 directly contacting and sealing the cobalt layer. The cobalt layer is recessed within the pathway such that the metal cap layer 60 directly contacts the barrier layer 54 and the cobalt layer 56. The metal cap layers 60 can be planarized such that they are located entirely within the recesses and have top surfaces that are coplanar with the top surface of the dielectric layer 50. The metal cap layer that seals the contact structures is less chemically reactive to the reagents used in further CMOS processing than the cobalt layer. Multiple interconnect levels including contact structures are employed in some embodiments, each using cobalt as an electrical conductor and protecting the cobalt by metal cap layers in the areas that would be subject to possible attack from processing reagents.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are generally employed to indicate relative positions as opposed to relative elevations unless otherwise indicated.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
   forming a sacrificial gate on a semiconductor substrate;
   forming spacers on sidewalls of the sacrificial gate, the spacers having top surfaces;
   removing the sacrificial gate, thereby forming a trench bounded by the spacers;
   forming a gate dielectric layer within the trench;
   forming a first barrier layer on the gate dielectric layer;
   forming a cobalt gate on the first barrier layer;
   forming a first metal cap layer sealing the cobalt gate, the first metal cap layer being entirely within the trench and entirely beneath the top surfaces of the spacers, the first metal cap layer being less chemically reactive than the cobalt gate;
   forming a dielectric cap within the trench and on the first metal cap layer; and
   forming an interconnect layer on the substrate by:
      forming a dielectric layer on the substrate;
      forming pathways within the dielectric layer;
      forming a second barrier layer lining the pathways;
      forming a cobalt layer within the pathways and on the second barrier layer, and
      forming a second metal cap layer directly contacting and sealing the cobalt layer, the second metal cap layer being less chemically reactive than the cobalt layer.

2. The method of claim 1, wherein the step of forming the first metal cap layer further includes causing a self-aligned deposition of one or more metal layers for forming the first metal cap layer on the substrate and within the trench and recessing the one or more metal layers within the trench.

3. The method of claim 2, further comprising the step of planarizing the one or more metal layers for forming the first metal cap layer down to the spacers.

4. The method of claim 3, wherein the step of forming the interconnect layer further includes:
   recessing the cobalt layer within the pathways;
   causing a self-aligned deposition of one or more metal layers for forming the second metal cap layer, and
   planarizing the one or more metal layers for forming the second metal cap layer such that the second metal cap layer and the dielectric layer have coplanar top surfaces.

5. The method of claim 4, wherein the first barrier layer comprises titanium nitride having a thickness of twenty nanometers or less.

6. The method of claim 5, wherein the second barrier layer comprises titanium nitride having a thickness of twenty nanometers or less.

7. The method of claim 1, wherein the first metal cap layer comprises ruthenium (Ru), rhodium (Rh), osmium (Os), iridium (Ir), molybdenum (Mo) or alloys thereof or tungsten (W) and has a thickness of three to fifteen nanometers.

8. The method of claim 1, wherein the step of forming a first metal cap layer further includes causing the selective deposition of one or more metal layers for forming the first metal cap layer on an exposed surface of the cobalt gate.

9. The method of claim 1, wherein the first metal cap layer is selected from the group consisting of ruthenium (Ru), rhodium (Rh), osmium (Os), iridium (Ir), molybdenum (Mo) and alloys thereof.

10. The method of claim 1, wherein the first barrier layer comprises titanium nitride having a thickness of five nanometers or less.

11. The method of claim 1, wherein:
    the first metal cap layer is less chemically reactive to hydrofluoric acid than the cobalt gate; and
    the second metal cap layer is less chemically reactive to hydrofluoric acid than the cobalt layer.

12. A semiconductor structure comprising:
    a semiconductor substrate;
    a plurality of gate structures on the substrate, each gate structure including:
       a pair of spacers defining a trench, the spacers including top surfaces,
       a cobalt gate within the trench,
       a gate dielectric layer between the semiconductor substrate and the cobalt gate,
       a barrier layer between the gate dielectric layer and the cobalt gate,
       a first metal cap layer sealing the cobalt gate, the first metal cap layer being positioned entirely beneath the top surfaces of the spacers and being less chemically reactive than the cobalt gate, and
       a dielectric cap within the trench and on the first metal cap layer;
    a dielectric layer on the substrate; and
    a plurality of contact structures within the dielectric layer, each of the contact structures including:
       a pathway within the dielectric layer,
       a second barrier layer lining the pathway,
       a cobalt layer directly contacting the second barrier layer and recessed within the pathway, and
       a second metal cap layer directly contacting and sealing the cobalt layer, the second metal cap layer being less chemically reactive than the cobalt layer.

13. The semiconductor structure of claim 12, wherein the first metal cap layer comprises ruthenium (Ru), rhodium (Rh), osmium (Os), iridium (Ir), molybdenum (Mo) or alloys thereof or tungsten (W).

14. The semiconductor structure of claim 12, wherein the second metal cap layer comprises ruthenium (Ru), rhodium (Rh), osmium (Os), iridium (Ir), molybdenum (Mo) or alloys thereof or tungsten (W).

15. The semiconductor structure of claim 12, wherein:
    the first metal cap layer is less chemically reactive to hydrofluoric acid than the cobalt gate; and
    the second metal cap layer is less chemically reactive to hydrofluoric acid than the cobalt layer.

16. The semiconductor structure of claim 12, wherein the second metal cap layer and the dielectric layer have coplanar surfaces.

17. The semiconductor structure of claim 12, wherein the dielectric cap is entirely within the trench.

18. The semiconductor structure of claim 12, wherein the first metal cap layer includes a platinum group metal.

19. The method of claim 1, wherein:
    the first metal cap layer is less chemically reactive than the cobalt gate during downstream CMOS processing; and the second metal cap layer is less chemically reactive to hydrofluoric acid than the cobalt layer during downstream CMOS processing.

20. The method of claim 1, wherein:

the first metal cap layer is less chemically reactive than the cobalt gate during at least one of an etch process and wet clean; and the second metal cap layer is less chemically reactive to hydrofluoric acid than the second cobalt layer during at least one of the etch process and wet clean.

* * * * *